(12) United States Patent
Sumi

(10) Patent No.: US 8,140,176 B2
(45) Date of Patent: Mar. 20, 2012

(54) ELECTRONIC COMPONENT MOUNTING SYSTEM AND ELECTRONIC COMPONENT MOUNTING METHOD

(75) Inventor: Hideki Sumi, Fukuoka (JP)

(73) Assignee: Panasonic Corporation, Osaka (JP)

( * ) Notice: Subject to any disclaimer, the term of this patent is extended or adjusted under 35 U.S.C. 154(b) by 331 days.

(21) Appl. No.: 12/160,398

(22) PCT Filed: Dec. 27, 2006

(86) PCT No.: PCT/JP2006/326083
§ 371 (c)(1),
(2), (4) Date: Jul. 9, 2008

(87) PCT Pub. No.: WO2007/080793
PCT Pub. Date: Jul. 19, 2007

(65) Prior Publication Data
US 2010/0223781 A1    Sep. 9, 2010

(30) Foreign Application Priority Data
Jan. 11, 2006   (JP) .................................. 2006-003388

(51) Int. Cl.
*G06F 19/00* (2011.01)
*B23P 19/00* (2006.01)

(52) U.S. Cl. ........ 700/116; 700/115; 700/121; 382/141; 29/739

(58) Field of Classification Search .................. 700/115, 700/116, 121; 382/141; 29/739
See application file for complete search history.

(56) References Cited

U.S. PATENT DOCUMENTS

| | | | |
|---|---|---|---|
| 6,480,751 B1 * | 11/2002 | Kuribayashi et al. | 700/56 |
| 7,356,176 B2 * | 4/2008 | Fujii et al. | 382/141 |
| 2005/0190956 A1 * | 9/2005 | Fujii et al. | 382/141 |
| 2005/0219336 A1 * | 10/2005 | Hayasaki et al. | 347/86 |
| 2007/0050075 A1 * | 3/2007 | Johnson et al. | 700/121 |

FOREIGN PATENT DOCUMENTS

| | | | |
|---|---|---|---|
| JP | 1-160095 | * | 12/1987 |
| JP | 1-160095 | | 6/1989 |
| JP | 2-185352 | | 7/1990 |

(Continued)

OTHER PUBLICATIONS

International Search Report issued Jan. 30, 2007 in the International (PCT) Application No. PCT/JP2006/326083.

(Continued)

*Primary Examiner* — Kakali Chaki
*Assistant Examiner* — Sivalingam Sivanesan
(74) *Attorney, Agent, or Firm* — Wenderoth, Lind & Ponack, L.L.P.

(57) ABSTRACT

In an electronic component mounting system constituted by interconnecting a plurality of mounting apparatuses, a board ID code attached by digital data to the board is read in a board supply apparatus located in the uppermost stream and transmitted to the mounting apparatuses on the downstream side via communication means. By comparing the transmitted board ID code with mounting nonrequirement board code data (defective board code, read error code, dummy board code, etc.) preparatorily stored in a storage section in the mounting apparatus, it is determined whether or not execution of mounting operation of the board is required, and the board determined to be not required to be subjected to mounting is unloaded to the downstream side without carrying out mounting works and without line stop.

1 Claim, 8 Drawing Sheets

FOREIGN PATENT DOCUMENTS

| | | | |
|---|---|---|---|
| JP | 2004-167622 | * | 11/2002 |
| JP | 2003-110297 | * | 4/2003 |
| JP | 2004-327696 | * | 4/2003 |
| JP | 2004-167622 | | 6/2004 |
| JP | 2004-327696 | | 11/2004 |

OTHER PUBLICATIONS

International Preliminary Report on Patentability issued Jul. 24, 2008 in the International (PCT) Application No. PCT/JP2006/326083.

* cited by examiner

40a

| BOARD ID | COMPARTMENT COUNT | MOUNTING NONREQUIREMENT COMPARTMENT |
|---|---|---|
| A001 | 1 | (1,1) |
| ⋮ | | |
| ⋮ | | |
| B001 | 4 | (1,2) |
| ⋮ | | |
| C001 | 1 | (1,1) |

# ELECTRONIC COMPONENT MOUNTING SYSTEM AND ELECTRONIC COMPONENT MOUNTING METHOD

TECHNICAL FIELD

The present invention relates to an electronic component mounting system constituted by interconnecting electronic component mounting apparatuses for mounting an electronic component on a board so that a continuous board conveyance path is formed and an electronic component mounting method.

BACKGROUND ART

In an electronic component mounting line, an electronic component mounting system is generally constituted by interconnecting a plurality of electronic component mounting apparatuses so that a continuous board conveyance line (board conveyance path) is formed. In such an electronic component mounting system, electronic components are successively mounted on a board by the electronic component mounting apparatuses during the process in which the board successively passes the electronic component mounting apparatuses through the board conveyance line (refer to, for example, Patent Document 1: JP 2003-110297 A). In the electronic component mounting system as described above, it is general that mounting works are carried out on boards of a plurality of different board types, and it is sometimes the case where a dummy board (a board for lot change or a board for type change) is inserted to indicate the timing of type change every prescribed lot count with regard to an identical type when a plurality of boards are loaded into the board conveyance line. When it is detected that the board is the dummy board by identification information read means provided for the board conveyance line, a set-up change work accompanying the type change such as a mounting program change or the like is executed.

DISCLOSURE OF INVENTION

Problems to be Solved by the Invention

In recent years, in the electronic component mounting system, efforts to automate the set-up change work accompanying the type change as far as possible and shorten a line stop time during the set-up change are made.

However, in the conventional apparatus including the electronic component mounting system of Patent Document 1 taken as an example, the measure of taking out the dummy board by temporarily stopping the line or similar measure is performed when the dummy board is detected, and therefore, it is necessary to perform manual operation for restarting the line every occasion of type change.

Moreover, such line stop and line restart similarly occur also when ID information such as a bar code label attached to the board for securing the traceability for each board cannot be read by some reasons, and this hinders an improvement in the operating rate.

An object of the present invention is to solve the above problems and provide an electronic component mounting system and an electronic component mounting method capable of improving the operating rate by eliminating the unnecessary conveyance line stop.

Means for Solving the Subject

In order to achieve the above object, the present invention is constructed as follows.

According to a first aspect of the present invention, there is provided an electronic component mounting system constituted by interconnecting a plurality of electronic component mounting apparatuses independently having a control unit for executing control of mounting operation for mounting an electronic component on a board so that a continuous board conveyance path is formed, the system comprising:

an identification information read device which is placed in an uppermost stream of the continuous board conveyance path, for reading identification information attached to the board;

wired or wireless communication means which interconnects the identification information read device with the control unit, for transmitting the identification information read by the identification information read device to the control unit of each electronic component mounting apparatus located on the downstream side of the board conveyance path; and mounting requirement/nonrequirement determination means for determining whether or not execution of mounting operation of each board is required by comparing the transmitted identification information with preparatorily stored mounting requirement/nonrequirement determination information associated with the identification information in each of the control units.

According to a second aspect of the present invention, there is provided the electronic component mounting system as defined in the first aspect, wherein the communication means transmits the identification information read by the identification information read device to the control unit of the electronic component mounting apparatus into which the board is loaded in accordance with conveyance timing of the board between mutually adjacent electronic component mounting apparatuses.

According to a third aspect of the present invention, there is provided the electronic component mounting system as defined in the first aspect, wherein the communication means transmits error board identification information indicating that the board is a read error board to the control unit on the downstream side on the basis of identification abnormality information of an event that the identification information has not been normally read in the identification information read device.

According to a fourth aspect of the present invention, there is provided the electronic component mounting system as defined in the first aspect, wherein each of the control units skips the mounting operation of the board of which the identification information has been read and unloads the board to the downstream side when the transmitted identification information is lot change board identification information indicating a board production lot change timing and executes processing of changing a mounting program for carrying out the mounting operation of a board loaded following the board.

According to a fifth aspect of the present invention, there is provided an electronic component mounting system constituted by interconnecting a plurality of electronic component mounting apparatuses for mounting an electronic component on a board so that a continuous board conveyance path is formed and including a control unit for executing control of mounting operation in each of the electronic component mounting apparatuses, the system comprising:

an identification information read device which is placed in an uppermost stream of the continuous board conveyance path, for reading identification information attached to the board;

wired or wireless communication means which interconnects the identification information read device with the control unit, for transmitting the identification information read by the identification information read device to the control unit; and mounting requirement/nonrequirement determination means for determining whether or not execution of mounting operation of each board is required in each of the electronic component mounting apparatuses by comparing the transmitted identification information with preparatorily stored mounting requirement/nonrequirement determination information associated with the identification information in the control units.

According to a sixth aspect of the present invention, there is provided an electronic component mounting method by an electronic component mounting system constituted by interconnecting a plurality of electronic component mounting apparatuses for mounting an electronic component on a board so that a continuous board conveyance path is formed, the method comprising:

reading identification information attached to the board loaded into the continuous board conveyance path;

transmitting the read identification information to each of the electronic component mounting apparatuses located on the downstream side of the board conveyance path by urging wired or wireless communication means which interconnects the identification information read device with the control unit; and determining whether or not execution of mounting operation of each board is required in each of the electronic component mounting apparatuses by comparing the transmitted identification information with preparatorily stored mounting requirement/nonrequirement determination information associated with the identification information.

According to a seventh aspect of the present invention, there is provided the electronic component mounting method as defined in the sixth aspect, wherein the read identification information is transmitted to the electronic component mounting apparatus into which the board is loaded in accordance with a conveyance timing of the board between mutually adjacent electronic component mounting apparatuses in transmitting the identification information.

According to an eighth aspect of the present invention, there is provided the electronic component mounting method as defined in the sixth aspect, wherein error board identification information indicating that the board is a read error board is transmitted as the identification information to the electronic component mounting apparatuses on the downstream side in transmitting the identification information when the identification information has not been normally read in reading the identification information.

According to a ninth aspect of the present invention, there is provided the electronic component mounting method as defined in the sixth aspect, wherein, when the read identification information is lot change board identification information indicating production lot change timing of the board in reading the identification information, the lot change board identification information is transmitted as the identification information in transmitting the identification information to skip the mounting operation of the board of which the identification information has been read and unload the board to the downstream side in each of the electronic component mounting apparatuses and to execute processing of changing a mounting program for carrying out the mounting operation of a board loaded following the board.

Effects of the Invention

According to the present invention, by reading the identification information attached to the board, transmitting the information to the apparatuses on the downstream side by the communication means and determining whether or not execution of the mounting operation of each board is required by comparison with the preparatorily stored mounting requirement/nonrequirement determination information, the board determined as not required to be subjected to mounting can be unloaded without line stop, and the line operating rate can be improved with elimination of the unnecessary line stop of the board conveyance line.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1:
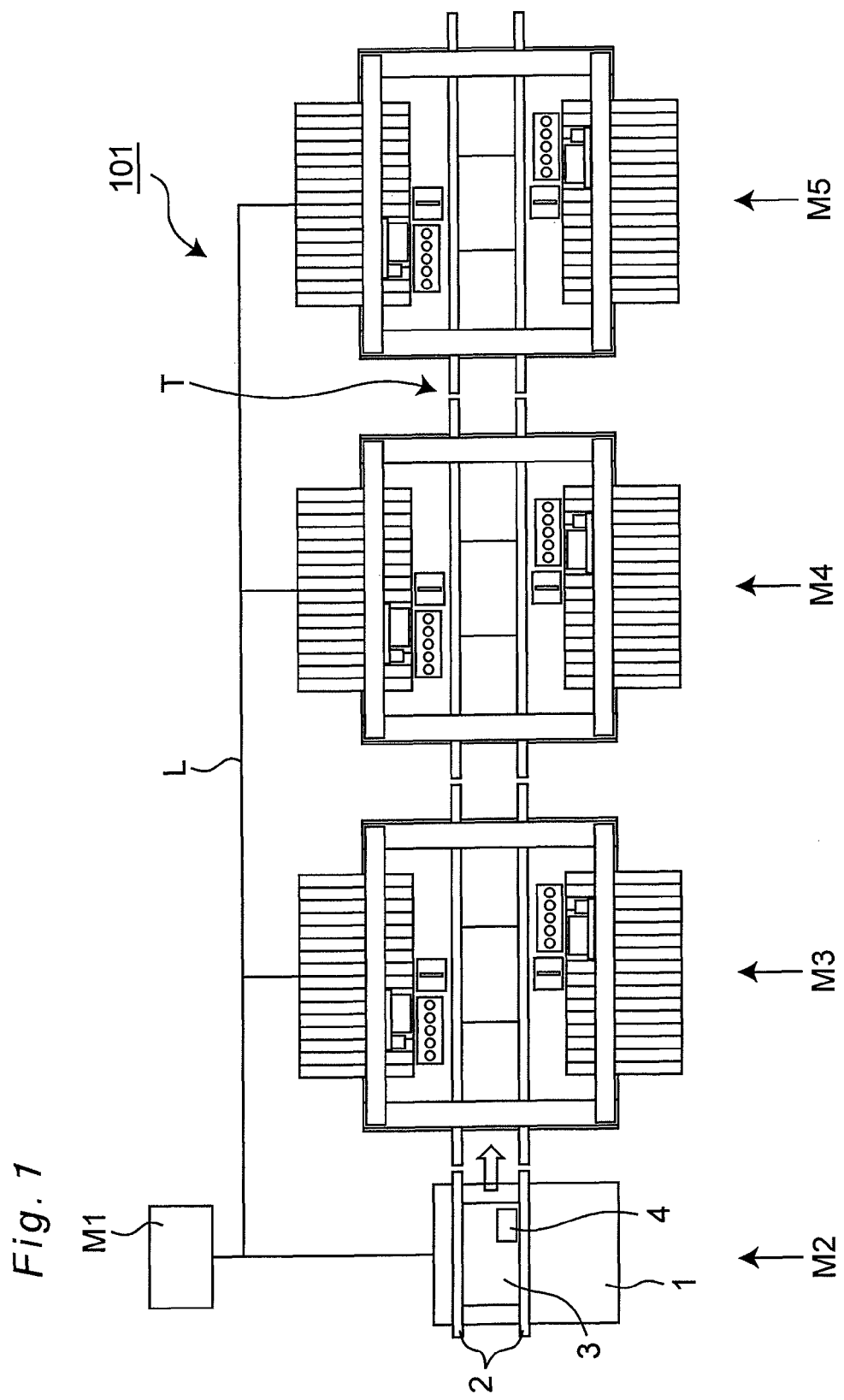
FIG. 1 is a schematic view of an electronic component mounting system according to one embodiment of the present invention.

Before the description of the present invention proceeds, it is to be noted that like parts are designated by like reference numerals throughout the accompanying drawings.

Hereinbelow, an embodiment of the present invention will be described in detail with reference to the accompanying drawings.

Figure 2:
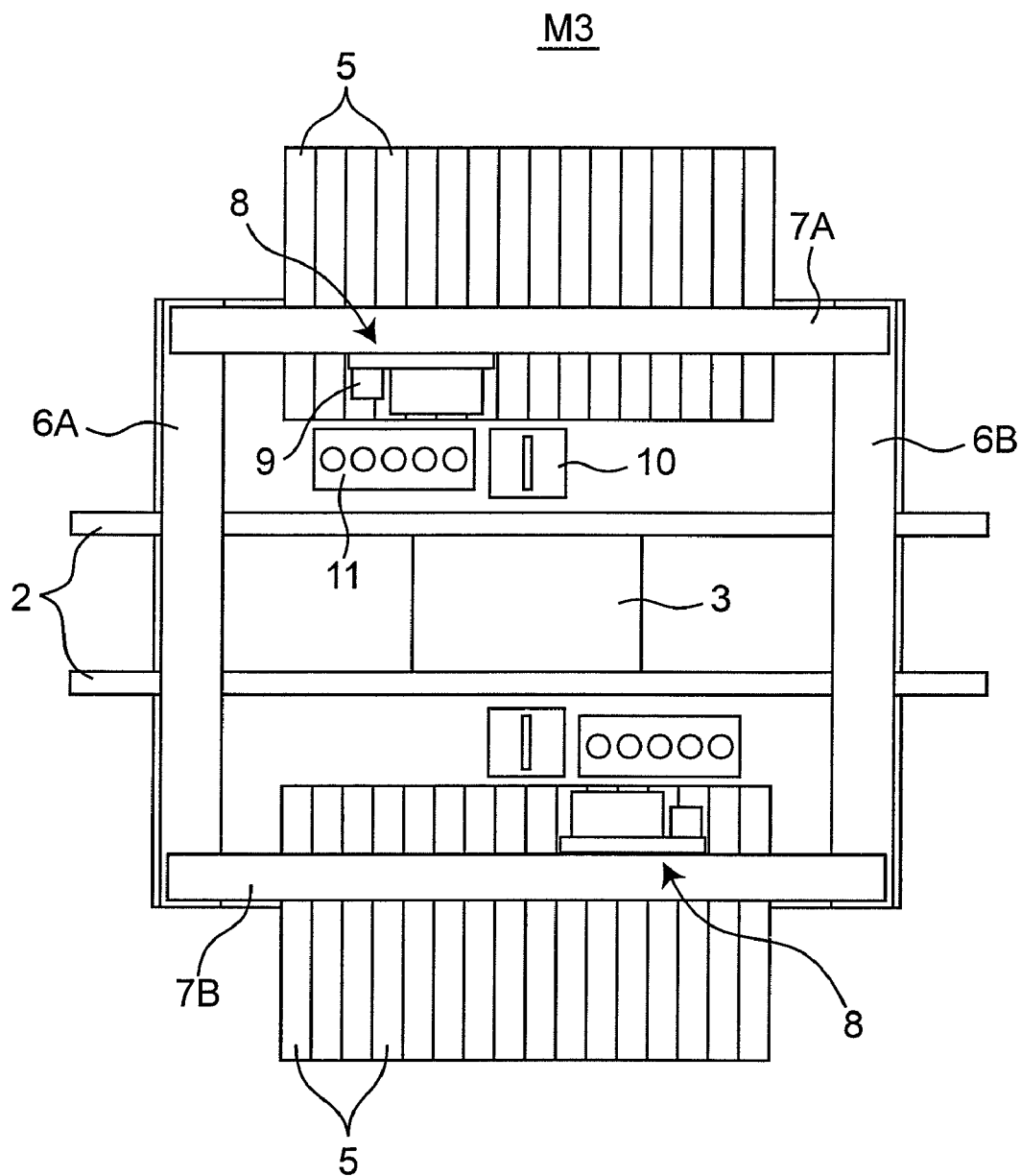
FIG. 2 is a plan view of an electronic component mounting apparatus that constitutes the electronic component mounting system of the embodiment.
Figure 3:
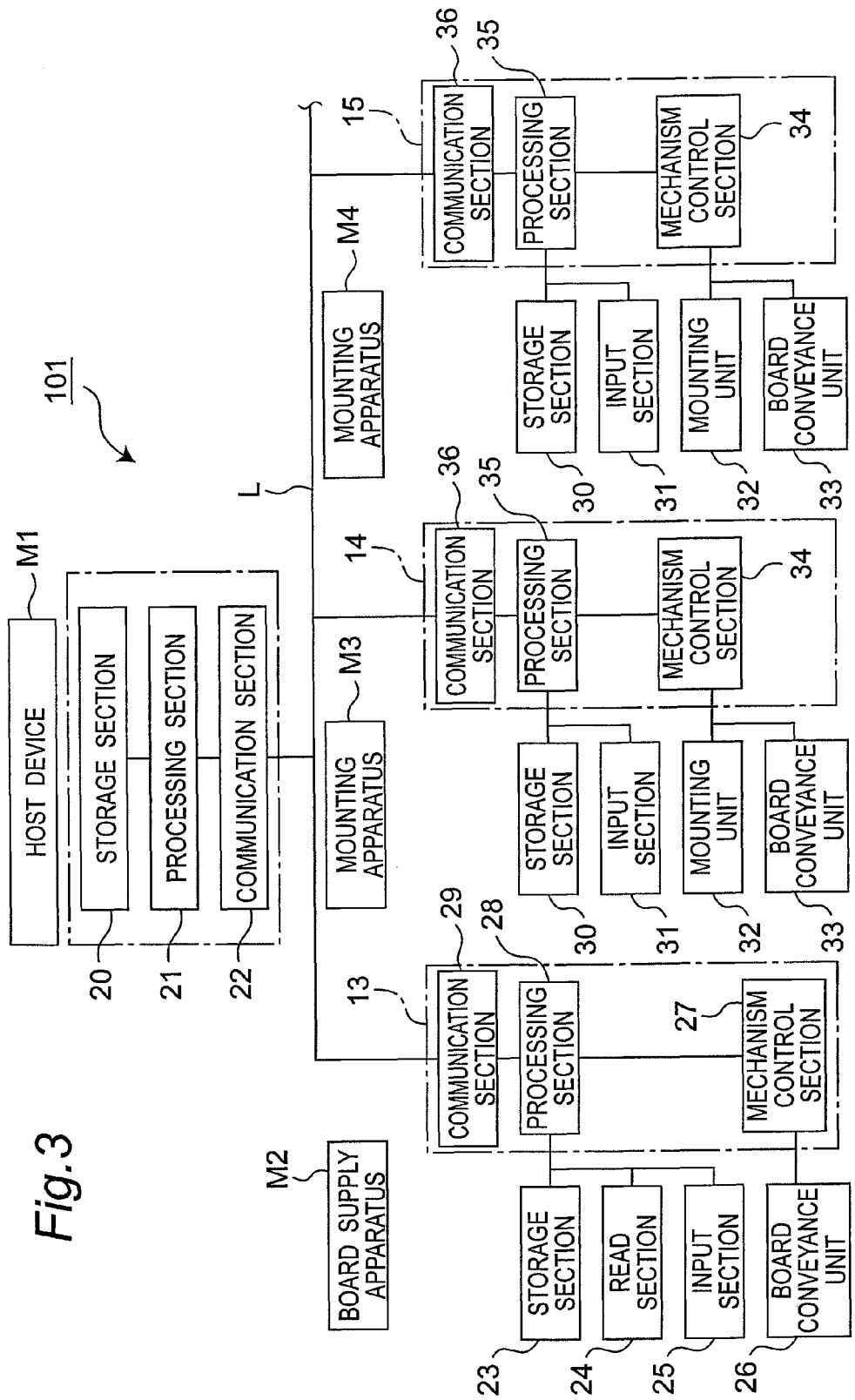
FIG. 3 is a block diagram showing the construction of a control system in the electronic component mounting system of the embodiment.

FIG. 1 is a schematic structural view of an electronic component mounting system 101 according to one embodiment of the present invention. FIG. 2 is a schematic plan view of an electronic component mounting apparatus M2 that constitutes the electronic component mounting system 101 of the present embodiment. FIG. 3 is a block diagram showing the principal construction of a control system of the electronic component mounting system 101 of the present embodiment.

Figures 4A, 4B:
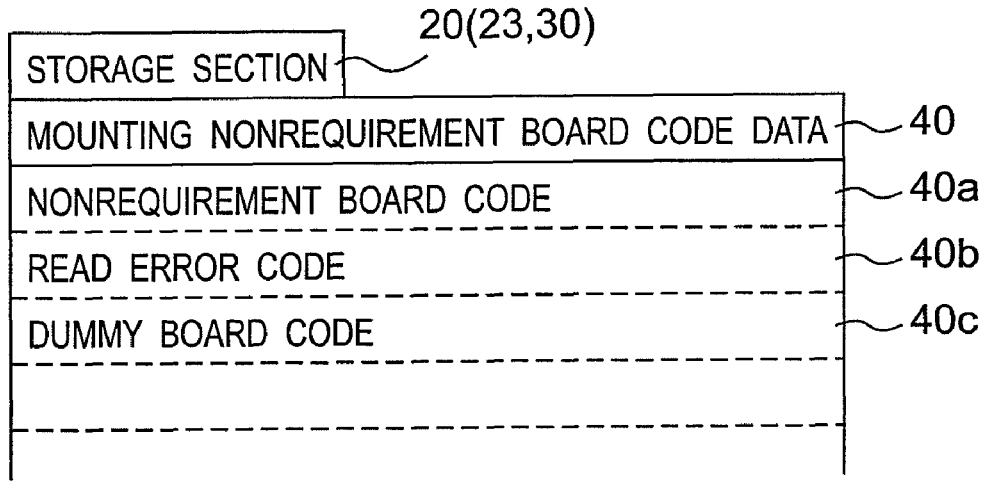
FIG. 4A is an explanatory view of a mounting nonrequirement board code data in the electronic component mounting system of the embodiment.
FIG. 4B is an explanatory view showing one example of the nonrequirement board code data in the electronic component mounting system of the embodiment.
Figure 5:
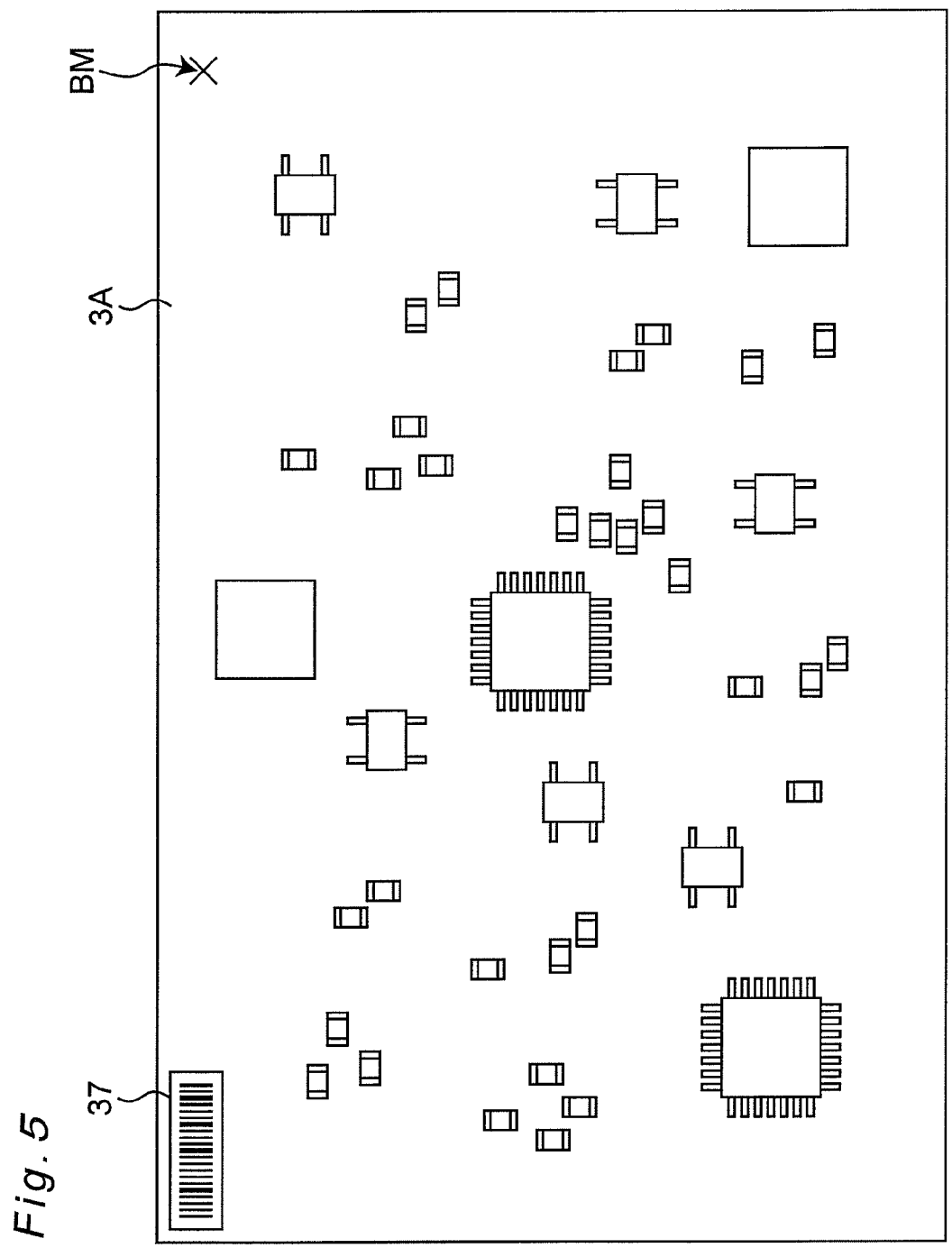
FIG. 5 is a plan view of a board to be subjected to mounting in the electronic component mounting system of the embodiment.
Figure 6:
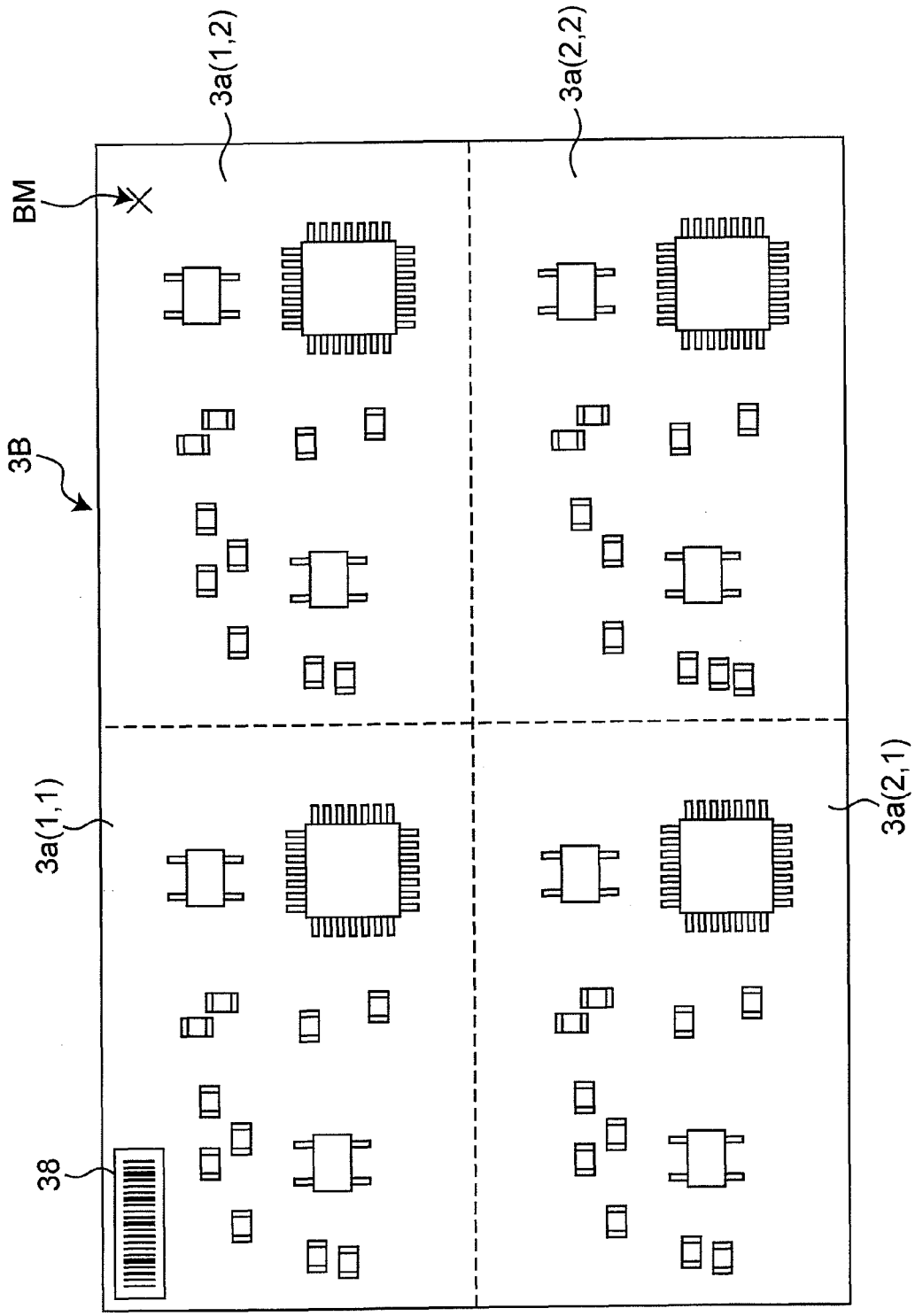
FIG. 6 is a plan view of a board to be subjected to mounting in the electronic component mounting system of the embodiment.
Figure 7:
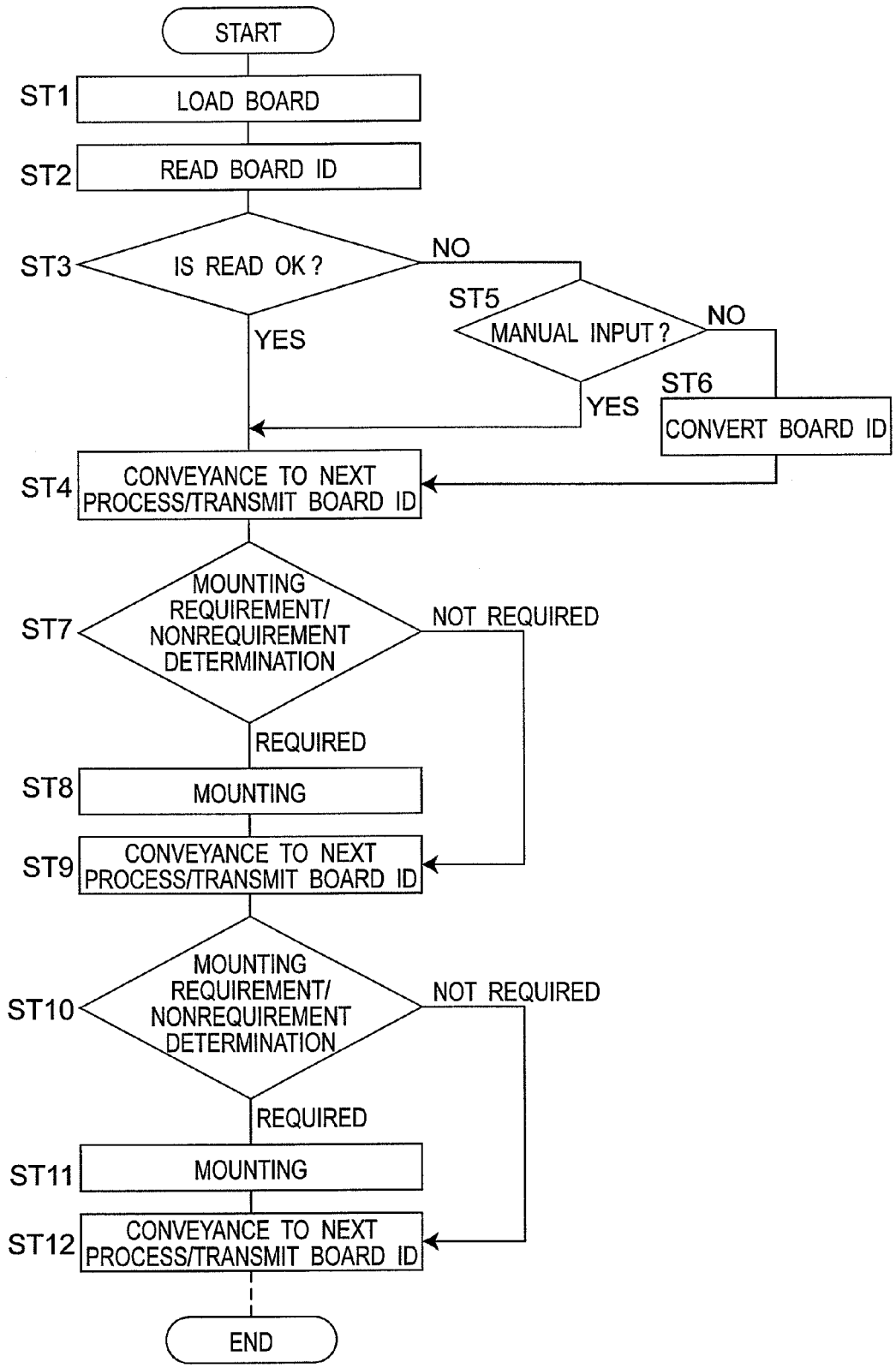
FIG. 7 is a flow chart of an electronic component mounting method of the embodiment.
Figure 8:
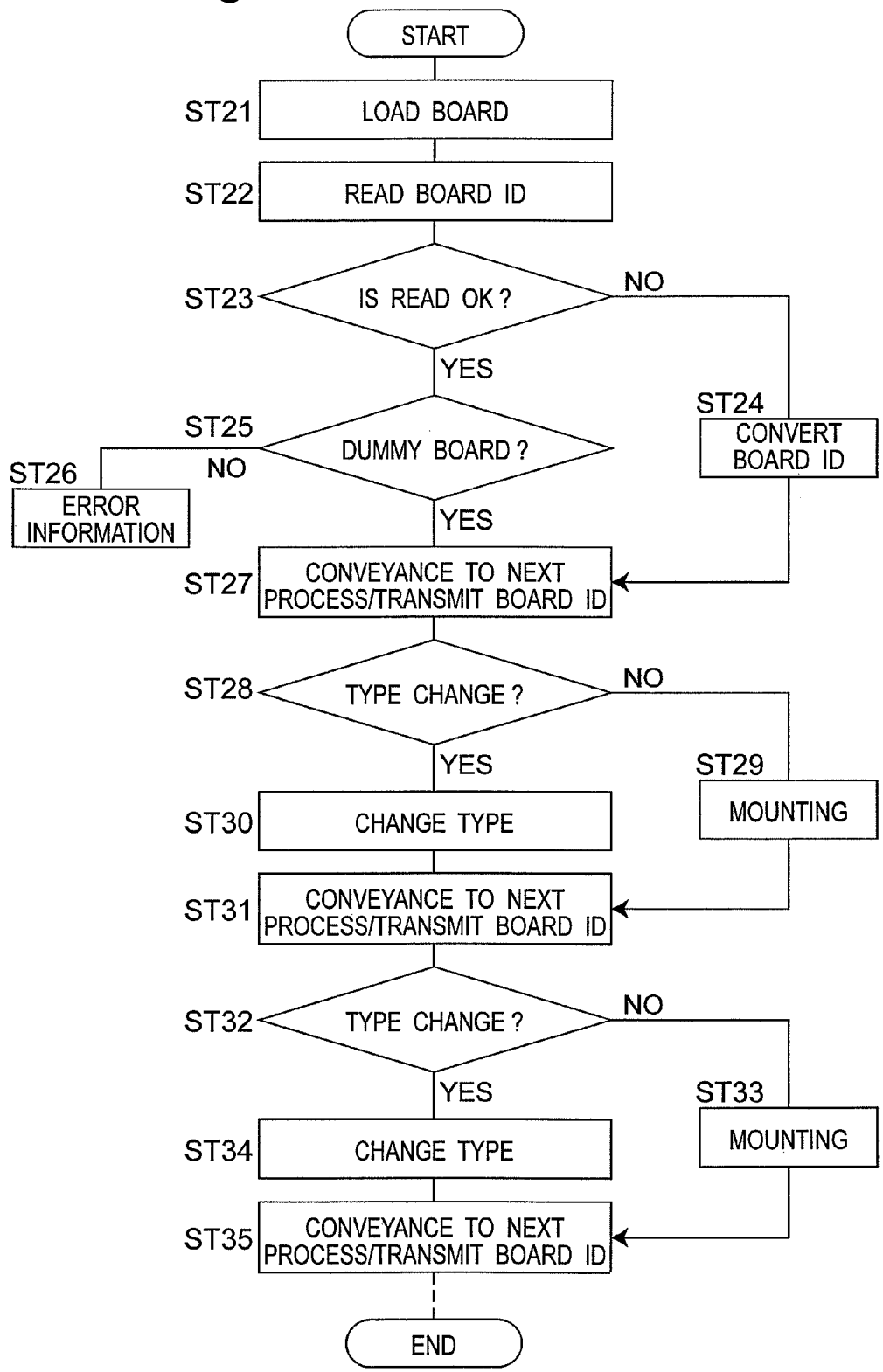
FIG. 8 is a flow chart of another electronic component mounting method of the embodiment.

FIG. 4A and FIG. 4B are schematic explanatory views of mounting nonrequirement board code data in the electronic component mounting system 101 of the present embodiment. FIG. 5 and FIG. 6 are schematic plan views of boards to be subjected to mounting in the electronic component mounting system 101 of the present embodiment. FIG. 7 and FIG. 8 are flow charts of the electronic component mounting method of the present embodiment.

The construction of the electronic component mounting system 101 is first described with reference to FIG. 1. In FIG. 1, the electronic component mounting system is constituted by connecting in series a board supply apparatus M2 and, for example, three mounting apparatuses M3, M4, M5 as a plurality of electronic component mounting apparatuses for mounting electronic components on a board and forming a continuous board conveyance line (board conveyance path) T through which the board is conveyed from the board supply apparatus M2 via the mounting apparatus M3, the mounting apparatus M4 to the mounting apparatus M5. Control units (see FIG. 3) of the board supply apparatus M2 and the mounting apparatuses M3, M4, M5 are interconnected by a LAN system L, and a host device M1 that is the overall control computer is connected to the LAN system L. Although the LAN system L is used as information communication means between the control units in the electronic component mounting system 101 of the present embodiment, communication means of serial communication or the like can be adopted in place of the above case. The LAN system and the communication means of serial communication or the like are not limited to the cases of wired communications but allowed to be wireless communications executed.

The board supply apparatus M2 has a function to supply a board 3 to be subjected to mounting to the mounting apparatuses M3, M4, M5 located on the downstream side in the board conveyance line T and has a construction in which a conveyance unit 2 having conveyance rails for conveying the board 3 on a base 1 is provided along the board conveyance line T. A label read unit 4 for reading a bar code label attached to the board 3 is placed on the conveyance unit 2. Identification information (ID information) that specifies the individual board 3 by, for example, digital information is printed with a bar code on the bar code label. The label read unit 4 is located on the uppermost stream side of the board conveyance line T in the electronic component mounting system 101 and serves as one example of the identification information read section that reads the attached identification information by the digital data with the use of the bar code to the board 3 to be subjected to mounting conveyed to the conveyance unit 2 of the board supply apparatus M2. The identification information is only required to be information capable of specifying one board from other boards and allowed to be provided by analog information without being limited only to the digital information.

Next, the structures of the mounting apparatuses M3, M4, M5 are described with reference to FIG. 2. Since the mounting apparatuses M3, M4, M5 have substantially similar structures, the mounting apparatus M3 is shown as a representative of the mounting apparatuses M3, M4, M5 in FIG. 2. In FIG. 2, the mounting apparatus M3 has a conveyance unit 2 that can be connected to the conveyance unit 2 of the board supply apparatus M2, and a component supply device in which a plurality of tape feeders 5 are arranged is placed on both sides of the conveyance unit 2. The tape feeders 5 supply electronic components to component suction positions of suction nozzles of mounting heads described below by pitch-feeding carrier tapes that are holding the electronic components.

Y-axis tables 6A, 6B are provided for the mounting apparatus M3, and two X-axis tables 7A, 7B are provided on the Y-axis tables 6A, 6B. The X-axis table 7A horizontally moves in the Y direction by driving the Y-axis table 6A, and the X-axis table 7B horizontally moves in the Y direction by driving the Y-axis table 6B. A mounting head 8 and a board recognition camera 9 that moves integrally with the mounting head 8 are placed on the X-axis tables 7A, 7B. The mounting head 8 are horizontally moved by driving the Y-axis table 6A, the X-axis table 7A, the Y-axis table 6B and the X-axis table 7B in combination, pick up electronic components from the respective tape feeders 5 by the suction nozzles and mount the components on the board 3 positioned by the conveyance unit 2. The board recognition camera 9 moves together with the mounting head 8 on the board 3 to image and recognize the board 3.

A component imaging section 10 and a nozzle holding unit 11 are provided in a path from the tape feeder to the conveyance unit 2. By moving the electronic component held by the suction nozzle in the X-direction above the component imaging section 10 when the mounting head 8 that has picked up the electronic component from the tape feeder 5 is moved to the board 3 positioned on a mounting stage, a component recognition camera 22 obtains the image of the electronic component. The nozzle holding unit 11 accommodates a plurality of types of suction nozzles in prescribed postures, and the suction nozzle is replaced the mounting head 8 makes an access to the nozzle holding unit 11 to replace the nozzle in accordance with the type of the objective electronic component in the mounting head 8.

The principal construction of the control system of the electronic component mounting system 101 is described next with reference to FIG. 3. The board supply apparatus M2 and the mounting apparatuses M3, M4 (the mounting apparatus M5 is not shown in FIG. 3) that constitute the electronic component mounting system 101 are each provided with control units 13, 14, 15 as independent control functions and are communicatably interconnected by a LAN system L and linked also to the host device (main control unit) M1 via the LAN system L.

In FIG. 3, the host device M1 includes a storage section 20, a processing section 21 and a communication section 22. The storage section 20 stores a variety of data, such as board code data described later, necessary for controlling the mounting works by the electronic component mounting system. The processing section 21 has a data operation processing function and executes various operation processing and data processing on the basis of various data stored in the storage section 20 and data received from other apparatuses that constitute the electronic component mounting line. The processed data are transmitted to the other apparatuses that constitute the electronic component mounting system via the communication section 22, and the processed data are written into the storage section 20.

The construction of the board supply apparatus M2 is described. The board supply apparatus M2 has a storage section 23, a read section 24, an input section 25, a board conveyance unit 26, a mechanism control section 27, processing section 28 and a communication section 29. The storage section 23 stores various data such as board code data of the board to be subjected to mounting in the electronic component mounting system 101. The read section carries out the processing of reading and identifying the board ID code (identification information) attached to each board on the basis of bar code data detected by the label read unit 4 shown in FIG. 1. The input section 25 is an input device of a keyboard, a touch panel and so on and performs inputting of various data such as manual inputting of the board ID code. The board conveyance unit 26 is a device for driving the conveyance operation of the board 3 by the conveyance unit 2.

The mechanism control section 27 controls the driving of the board conveyance unit 26. The processing section 28 carries out various data processing such as data import and data write for the storage section 23, the read section 24 and the input section 25 and carries out the processing of issuing an instruction with a control signal to the mechanism control section 27 on the basis of the imported data. The communication section 29 is connected to the other apparatuses via the LAN system L, and the data transmitted from the other apparatuses are delivered to the processing section 28 via the communication section 29. Moreover, the data sent from the processing section 28 is transmitted to the LAN system L via the communication section 29. The mechanism control section 27, the processing section 28 and the communication section 29 constitute the control unit 13 of the board supply apparatus M2.

The ID code read by the label read unit 4 is transmitted to the control units 14, 15 of the mounting apparatuses M2, M3 located on the downstream side of the conveyance line L via the LAN system L by the communication section 29. That is, the LAN system L serves as network means or communication means for interconnecting the control units of the electronic component mounting apparatuses and transmitting the board ID code that is at least the identification information to the apparatuses on the downstream side. In the present embodiment, the ID code is transmitted to the apparatuses on the downstream side generally simultaneously with the board conveyance timing at which the board is conveyed to the downstream side as described later.

The construction of the mounting apparatus M3 is described next. Since the mounting apparatuses M4, M5 have the same construction as that of the mounting apparatus M3, no description is provided therefor. The mounting apparatus M3 has a storage section 30, an input section 31, a mounting unit 32, a board conveyance unit 33, a mechanism control section 34, a processing section 35 and a communication section 36. The storage section 30 stores the data of the components to be mounted on the board besides the data concerning the board to be subjected to mounting, such as board code data. The input section 31 is an input device of a keyboard, a touch panel and so on and performs inputting of various data such as manual inputting of the board code data as in the input section 25. The mounting unit 32 is a device that executes the component mounting operation of mounting electronic components on the board 3 loaded from the apparatuses on the upstream side in the board conveyance line L, and the board conveyance unit 33 is a device that drives the conveyance operation of the board 3 by the conveyance unit 2. The mechanism control section 34 controls the mounting unit 32 and the board conveyance unit 33.

The processing section 35 carries out various data processing such as data import and data write for the storage section 30 and the input section 31 and carries out the processing of issuing an instruction with a control signal to the mechanism control section 34 on the basis of the imported data. The communication section 36 is connected to the other apparatuses via the LAN system L, and the data transmitted from the other apparatuses are delivered to the processing section 35 via the communication section 36. Moreover, the data sent from the processing section 35 is transmitted to the LAN system L via the communication section 36. The mechanism control section 34, the processing section 35 and the communication section 36 constitute the control units 14, 15 of the mounting apparatuses M3, M4.

Mounting nonrequirement board code data 40 stored in the storage section 20 is described next with reference to FIG. 4A. It is noted that the data of the same contents as those sent via the LAN system L are stored also into the storage section 23 and the storage section 30. The mounting nonrequirement board code data is a collection of the board codes attached to the boards that are not required to be subjected to the component mounting operation in the mounting apparatuses M3, M4, M5 among the boards 3 supplied to the downstream side of the board conveyance line T by the board supply apparatus M2. The reason why the component mounting on the board is not required in the electronic component mounting system 101 is not single, and the mounting operation of the board is skipped for a plurality of reasons described below. It is noted that the mounting nonrequirement board code data 40 is one example of the mounting requirement/nonrequirement determination information associated with the board ID code and is data that include board codes of, for example, a nonrequirement board code 40a, a read error code 40b, a dummy board code 40c as described below.

First of all, the defective board code 40a is data for specifying the board that has been determined to be a defective product as a board through an inspection in the previous process, and the execution of the component mounting operation of the board to which the board code is attached is skipped. The defective board code 40a may be provided by receiving an input by means of the input section 25 of the board supply apparatus M2 in each of the apparatuses and writing the input into the storage sections 20, 23, 30 or by receiving inspection data outputted from a special inspection device in each of the apparatuses via the LAN system L.

FIG. 4B shows an example of the defective board code 40a. In the example shown here, a single product board such that one board becomes a product board as it is and a multi-product board such that a plurality of mounting compartments are set on one board and the one board is divided into a plurality of product boards every mounting compartment in a succeeding process are both served as intended objects. Therefore, the defective board code 40a has a data form that includes information for specifying the position of the mounting nonrequirement compartment. In this case, a compartment count representing the number of mounting compartments of the board and the positions of the mounting nonrequirement compartments that are not subjected to mounting among the mounting compartments are indicated in a matrix coordinates form.

If a concrete description is provided for FIG. 4B, a board ID code A001 is the ID code attached to a single product board 3A of the type A shown in FIG. 5 and is attached to the board by sticking a bar code label 37 to the board 3A. In this case, a bad mark BM indicating that the board is a defective board is attached to the board 3A in the previous process, and coordinates (1, 1) indicating that the board 3A of the single compartment is wholly a mounting nonrequirement compartment are written in the defective board code 40a.

A board ID code B001 is the ID code attached to a multi-product board 3B (four-product board in which four mounting compartments 3a are provided) of the type B shown in FIG. 6, and one bar code label 38 is attached to the board 3B. In this case, a mounting compartment 3a positioned at coordinates (1, 2) is a defective board compartment among the four mounting compartments of the board 3B. A bad mark BM indicating the defective board compartment is attached to the mounting compartment 3a in the previous process, and coordinates (1, 2) indicating the position of the mounting nonrequirement compartment of the plurality of mounting compartments 3a are written in the defective board code 40a.

There is an advantage that the defective board can be identified without attaching the bad mark BM directly to the board by registering the defective board code 40a with regard to either one of the types A and B. Moreover, although the case where the defective board code 40a is constituted so as to indicate that a certain mounting compartment is the defective board compartment has been described in the example shown in FIG. 4B, it may be a case where a construction such that a certain mounting compartment is indicated as not the defective board compartment in place of the above case. Moreover, it is also possible to constitute the data so that whether or not the mounting of each mounting compartment 3a of the multi-product board 3B is required differs depending on each of the mounting apparatuses M3, M4, M5.

The read error code 40b is a board code (error board identification information) in a special form, which is provided in a case where, in reading the board ID code by the label read unit 4 of the board supply apparatus M2, a read error of the board ID code occurs for a variety of reasons of the dropout, printing fault or the like of the bar code label, and manually or automatically provided for the board. That is, the board of which the board code could not been correctly read is the board of which the history cannot be identified, and therefore, the board cannot similarly be identified as it is in the apparatuses on the downstream side. In order to prevent such a trouble, the read error code indicating that the board is the read error board is given to the board where the read error has occurred. Then, the board to which such a read error code 40b is given has an unclear history, and therefore, the component mounting operation is skipped.

The dummy board code 40c is a board code (dummy board ID information) in a special form preliminarily given to the dummy board that is originally not subjected to mounting. In the electronic component mounting system 101, it is sometimes the case where a dummy board is loaded for a variety of purposes besides the boards subjected to actual production. Among the dummy boards, one which is loaded into the conveyance line as a lot end mark for indicating the timing of changing the production lot is used comparatively frequently during the normal line operation.

For example, as shown in FIG. 4B, the dummy board is inserted between the tail of the preceding type and the head of the succeeding type every time the type of the board to be subjected to mounting is changed from the type A to the type B or from the type B to a type C. Then, the dummy board is, of course, not subjected to the component mounting operation but unloaded from the conveyance line through a set-up change work accompanying the production lot change. It is noted that such a dummy board is one example of the lot change board, and the dummy board code 40c serves as one example of the lot change board identification information.

The mounting nonrequirement board code data 40 described above is the mounting requirement/nonrequirement determination information for determining whether or not the execution of component mounting operation for an individual board is required. In determining whether or not the mounting is required, the control units 14, 15 of the mounting apparatus M3 and the mounting apparatuses on the downstream side check the board ID code as the identification information transmitted from the board supply apparatus M2 via the LAN system L or via the host device M1 with the mounting nonrequirement board code data 40 stored in each storage section 30. When the board ID code coincides with the mounting nonrequirement board code data, the processing of unloading to the downstream side is executed by skipping the mounting operation for the board. That is, the control units 14 and 15 serve as the mounting requirement/nonrequirement determination means for determining whether or not the execution of the mounting operation for each board is required by comparing the identification information read in the apparatuses on the upstream side with the preparatorily stored mounting requirement/nonrequirement determination information associated with the identification information. It is acceptable to execute the processing described above by the control processing function of the host device M1 instead of determining whether or not the mounting is required by each mounting apparatus. In this case, the host device M1 functions as the mounting requirement/nonrequirement determination means.

The electronic component mounting method by the electronic component mounting system is described next. The component specifications of the boards to be subjected to mounting have variations and various existing forms for a board to which the board ID code for identification has originally been attached, a board to which no identification code has been attached and so on. In the example shown in the flow chart of FIG. 7, the board 3 to which the board ID code has preparatorily been attached is served as the intended object.

At the start of the mounting works, the board 3 is first loaded into the conveyance unit 2 of the board supply apparatus M2 (ST1 in the flow chart of FIG. 7). Next, the board ID code as the identification information attached by the digital data to the board 3 to be subjected to mounting is read by the label read unit 4 (ST2) (identification information read process). In the read operation, it is determined whether or not the read is OK, i.e., whether or not the board ID code has normally been read (ST3).

When the board ID code is normally read in this case, the board 3 after the completion of read is conveyed to the mounting apparatus M3 of the next process, and the read board ID code is transmitted to the mounting apparatus M3 via the LAN system L (ST4). That is, by transmitting the board ID code in accordance with the timing of the conveyance of the board 3, it becomes possible to associate the loaded board 3 with its board ID code in the mounting apparatus M3 on the reception side. On the contrary, when the board ID code could not normally be read, selection between manual inputting by means of the input section 25 of the board supply apparatus M2 and the execution of the processing of automatically attaching the board ID is made according to a preset operation mode.

In this case, it is first determined whether or not the manual inputting is executed (ST5), and when the execution of manual inputting is selected, an operator inputs the read error code 40b as the board ID code by means of the input section 25. When the execution of manual inputting has not preparatorily been selected, the read error code 40b read from the storage section 23 is automatically converted into the board ID code of the board (ST6), and the read error code 40b is given as the board ID code. Then, in either case, the program flow subsequently proceeds to (ST4) to similarly convey the board 3 to the mounting apparatus M3 of the next process, and the read error code 40b that has been manually inputted or automatically converted is transmitted as the board ID code to the mounting apparatus M3 via the LAN system L.

That is, the board ID code serving at least as the identification information is transmitted to the apparatuses on the downstream side by the network means (communication means) that interconnects the control units of the apparatuses in the processing described above (identification information transmission process). When the read of the board ID code has not normally been achieved in the identification information read process, a read error code (error board ID information) indicating that the board is the error board which has not undergone the normal read is transmitted to the apparatuses on the downstream side in the identification information transmission process.

In the mounting apparatus M3 into which the board 3 after identification is loaded, it is determined whether or not the board is required to be subjected to the mounting by cross-referring the transmitted board ID code with the mounting nonrequirement board code data stored in the storage section 30 by the processing section 35 (ST7) (mounting requirement/nonrequirement determination process). That is, when the transmitted board ID code coincides with none of the mounting nonrequirement board codes written in the storage section 30, the component mounting is carried out by determining that the "mounting is required" (ST8). When the transmitted board ID code has coincided with any one of the mounting nonrequirement board codes, the component mounting is skipped by determining that the "mounting is not required". For example, the execution of the mounting operation of the entire board is skipped for the board 3A of the board ID code A001 shown in FIG. 4B, and the execution of the component mounting on the mounting compartment 3a of the coordinate position (1, 2) among the four mounting compartments 3a is skipped for the board 3B of the board ID code B001.

Then, the board 3 is conveyed to the mounting apparatus M4 of the next process, and the board ID code transmitted from the upstream side is transmitted as it is to the mounting apparatus M4 in accordance with the timing of conveyance (ST9). Thereafter, (ST10) through (ST12) of the mounting apparatus M4 are executed as in (ST7) through (ST9) of the mounting apparatus M3, and similar processing is repetitively executed for the apparatuses located on the downstream side of the mounting apparatus M4.

A case where the dummy board for indicating the production lot change timing is conveyed as the board 3 is described here.

First of all, the dummy board is loaded as a board into the conveyance unit 2 of the board supply apparatus M2 (ST1). Next, the board ID code as the identification information attached to the dummy board, i.e., the dummy board code is read by the label read unit 4 (ST2). In the read operation, it is determined whether or not the read is OK (ST3). When the dummy board code is normally read in this case, the dummy board code after the completion of read is loaded into the mounting apparatus M3 of the next process, and the read dummy board code is transmitted to the mounting apparatus M3 via the LAN system L (ST4). When the read has not normally been achieved, ST5 or ST6 is carried out as in the case of the usual board 3.

In the mounting apparatus M3 into which the dummy board has been loaded, the transmitted ID code, i.e., the dummy board code is compared with the mounting nonrequirement code data stored in the storage section 30 by the processing section 35, and when the code coincides with the dummy board code preparatorily stored, it is determined that the mounting processing of the dummy board is not required and the board is unloaded to the next mounting apparatus M4. It is noted that the dummy board code is transmitted to the apparatuses on the downstream side in accordance with the unloading timing. Moreover, the mounting apparatus M3 carries out processing of changing the mounting program and so on by executing the type change processing in the mounting apparatus M3 on the basis of the coincidence of the dummy board code.

Next, an electronic component mounting method for a case where a board 3 to which no board ID code is attached is subjected to mounting and a dummy board for indicating the production lot change timing is inserted between the board types is described as a modification example of the component mounting method of the present embodiment with reference to FIG. 8. In this case, none of the board codes including the defective board code is attached, and therefore, the function to skip the component mounting on the board identified as the defective board is not provided.

The board 3 is first loaded into the conveyance unit 2 of the board supply apparatus M2 (ST21). Next, the board ID code as the identification information attached to the board 3 to be subjected to mounting is read by the label read unit 4 (ST22) (identification information read process). In the read operation, it is determined whether the read is OK, i.e., whether or not the board ID code has been read (ST23). Since no board ID code is originally attached to the board 3 to be the intended object, a state in which the board ID code is not read is the normal state.

That is, the board is regarded as the normal board when the board ID code is not read in (ST23), and the conversion of the board ID code, i.e., giving of the board ID code is performed for the board 3 as the intended object. At this time, the board ID code indicating the normal board is given instead of giving the read error board code as the mounting nonrequirement board code data as in the example shown in FIG. 7. Then, the board 3 after the completion of the processing is conveyed to the mounting apparatus M3 of the next process, and the newly attached board ID code is transmitted to the mounting apparatus M3 via the LAN system L (ST27).

When the board ID code is read in (ST23), it is determined whether or not the board is the intended dummy board by cross-referring the board ID code with the dummy board code 40c stored in the storage section 23 (ST25). In this case, when the answer is NO, error information is issued by determining that another unintended board is mixed (ST26). When the board is determined as the dummy board in (ST25), the program flow proceeds to (ST27) to convey the dummy board to the mounting apparatus M3 of the next process, and the read dummy board code 40c is transmitted to the mounting apparatus M3 via the LAN system L (ST27).

Next, it is determined whether or not the type change is effected in the mounting apparatus M3 (ST28). That is, when the board ID code does not coincide with the preparatorily stored dummy board code 40c by cross-referring the transmitted board ID code with the dummy board code 40c stored in the storage section 30 by the processing section 35, it is determined that the type change is not required, and the component mounting of the board 3 as the intended object is executed (ST29).

When the transmitted board ID code coincides with the dummy board code 40c, it is determined that the dummy board indicating the production lot change timing has arrived, and the type change is effected (ST30). As a result, mechanical adjustment works such as necessary jig replacement are performed by the operator, and the processing of changing the mounting program intended for the board loaded following the dummy board is carried out.

That is, according to the electronic component mounting method described above, when the identification information read in the identification information read process is the dummy board ID information that indicates the production lot change timing, the mounting on the board of which the identification information has been read is skipped, the board is unloaded to the downstream side, and the processing of changing the mounting program intended for the board loaded following the board is carried out.

As described above, the electronic component mounting method described in the present embodiment reads the identification information attached to the board, transmits the information to the apparatuses on the downstream side by the network means (communication means), compares the information with the preparatorily stored mounting requirement/nonrequirement determination information and determines whether or not the execution of the mounting operation of each board is required. By this operation, the board that has been determined to be not required to be subjected to mounting can be unloaded to the downstream side without line stop, and the line operating rate can be improved by eliminating the unnecessary line stop of the conveyance line.

It is enabled to associate the loaded board with the transmitted ID code in the mounting apparatus into which the board is loaded by transmitting the ID code to the downstream side generally simultaneously with the board conveyance timing at which the board is conveyed to the downstream side in the above description. However, in place of the above case, it may be a case where the transmission of the ID code to the apparatuses on the downstream side is previously executed, and the information that the board of the ID code is conveyed to the apparatuses on the downstream side in accordance with the board conveyance timing.

Moreover, the construction in which the host device M1 is provided besides the control units 14 and 15 provided independently for each of the mounting apparatuses M3, M4 has been described in the above description. However, in place of the above case, it may be a case where the control unit of the mounting apparatus is provided with the function as a host device. For example, it may be a case where a construction such that the control unit 14 of the mounting apparatus M3 on the upstream side is provided with the function as a host device, and communications are enabled between the control unit 14 having the host function and the other control units by communication means is adopted.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Application No. 2006-003388 filed on Jan. 11, 2006, including specification, drawings and claims for patent, are incorporated herein by reference in its entirety.

INDUSTRIAL APPLICABILITY

The electronic component mounting system and the electronic component mounting method of the present invention have the effect that the operating rate can be improved by eliminating the unnecessary conveyance line stop and are useful for a field where electronic components are mounted on a board by an electronic component mounting system constituted by interconnecting a plurality of electronic component mounting apparatuses.

The invention claimed is:

1. An electronic component mounting method by an electronic component mounting system constituted by interconnecting a plurality of electronic component mounting apparatuses for mounting an electronic component on a board such that a continuous board conveyance path is formed, the method comprising:
    reading identification information attached to the board loaded into the continuous board conveyance path;
    transmitting, with wired or wireless communication means, the read identification information to each of the electronic component mounting apparatuses located on a downstream side of the board conveyance path; and
    determining whether or not execution of mounting operation of each board is required in each of the electronic component mounting apparatuses by comparing the transmitted identification information with preparatorily stored mounting requirement/nonrequirement determination information associated with the identification information;
    wherein error board identification information indicating that the board is a read error board is transmitted as the identification information to at least one of the electronic component mounting apparatuses on the downstream side in transmitting the identification information when the identification information has not been normally read in reading the identification information.

* * * * *